United States Patent
Irving et al.

(10) Patent No.: US 9,023,560 B1
(45) Date of Patent: May 5, 2015

(54) ELECTROLESS PLATING METHOD USING NON-REDUCING AGENT

(71) Applicants: Mark Edward Irving, Rochester, NY (US); Thomas B. Brust, Webster, NY (US)

(72) Inventors: Mark Edward Irving, Rochester, NY (US); Thomas B. Brust, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 14/072,049

(22) Filed: Nov. 5, 2013

(51) Int. Cl.
C23C 18/20 (2006.01)
G03F 7/26 (2006.01)
G03F 7/40 (2006.01)

(52) U.S. Cl.
CPC .............. C23C 18/204 (2013.01); G03F 7/405 (2013.01); G03F 7/265 (2013.01)

(58) Field of Classification Search
CPC ........ C23C 18/204; G03F 7/265; G03F 7/405
USPC ............ 430/18, 315, 319, 321, 324; 427/304, 427/305, 306
See application file for complete search history.

(56) References Cited

U.S. PATENT DOCUMENTS

| | | | |
|---|---|---|---|
| 4,491,628 A | 1/1985 | Ito et al. | |
| 4,948,707 A * | 8/1990 | Johnson et al. | 430/311 |
| 5,281,447 A * | 1/1994 | Brady et al. | 427/555 |
| 6,436,615 B1 | 8/2002 | Brandow et al. | |
| 7,399,579 B2 | 7/2008 | Deng et al. | |
| 7,682,774 B2 | 3/2010 | Kim et al. | |
| 7,934,966 B2 | 5/2011 | Sasaki et al. | |
| 8,012,676 B2 | 9/2011 | Yoshiki et al. | |
| 2004/0069649 A1 * | 4/2004 | Katayama et al. | 205/125 |
| 2009/0205853 A1 * | 8/2009 | Larsson et al. | 174/256 |

FOREIGN PATENT DOCUMENTS

| | | |
|---|---|---|
| EP | 2 154 182 A1 | 2/2010 |
| JP | 09-316046 | 12/1997 |
| JP | 2013-028772 A * | 2/2013 |
| WO | 2009/006010 | 1/2009 |

OTHER PUBLICATIONS

Computer-generated translation of JP 2013-028772 (Feb. 2013).*

* cited by examiner

*Primary Examiner* — John A McPherson
(74) *Attorney, Agent, or Firm* — J. Lanny Tucker

(57) ABSTRACT

A conductive pattern is formed in a polymeric layer that has (a) a reactive polymer comprising pendant tertiary alkyl ester groups, (b) a compound that provides an acid upon exposure to radiation, and (c) a crosslinking agent. The polymeric layer is patternwise exposed to radiation to provide a polymeric layer comprising non-exposed regions and exposed regions comprising a polymer comprising carboxylic acid groups. The exposed regions are contacted with electroless seed metal ions to form a pattern of electroless seed metal ions. This pattern of electroless seed metal ions can be contacted with a non-reducing reagent that reacts with the electroless seed metal ions to form an electroless seed metal compound that has a $pK_{sp}$ of less than 40. This bound electroless seed metal compound is then electrolessly plated with a suitable conductive metal.

21 Claims, No Drawings

ELECTROLESS PLATING METHOD USING NON-REDUCING AGENT

RELATED APPLICATIONS

Reference is made the following related applications:

Copending and commonly assigned U.S. Ser. No. 14/071,765 filed on Nov. 5, 2013 by Brust, Falkner, and Irving and entitled "Forming Conductive Metal Patterns with Reactive Polymers."

Copending and commonly assigned U.S. Ser. No. 14/071,879 filed on Nov. 5, 2013 by Brust, Irving, Falkner, and Wyand, and entitled "Forming Conductive Metal Patterns Using Reactive Polymers."

Copending and commonly assigned U.S. Ser. No. 14/071,916 filed on Nov. 5, 2013 by Irving and Brust and entitled "Electroless Plating Method."

Copending and commonly assigned U.S. Ser. No. 14/071,951 filed on Nov. 5, 2013 by Irving and Brust and entitled "Electroless Plating Method Using Bleaching."

Copending and commonly assigned U.S. Ser. No. 14/071,993 filed on Nov. 5, 2013 by Irving and Brust and entitled "Electroless Plating Method Using Halide."

FIELD OF THE INVENTION

This invention relates to methods for forming metallic patterns, for example using electroless plating, using reactive polymers that can be crosslinked upon suitable irradiation.

BACKGROUND OF THE INVENTION

In recent decades accompanying rapid advances in information-oriented society, there have also been rapid technological advances to provide devices and systems for gathering and communicating information. Of these, display devices have been designed for television screens, commercial signage, personal and laptop computers, personal display devices, and phones of all types, to name the most common information sharing devices.

As the increase in the use of such devices has exploded in frequency and necessity by displacing older technologies, there has been a concern that electromagnetic radiation emission from such devices may cause harm to the human body or neighboring devices or instruments over time. To diminish the potential effects from the electromagnetic radiation emission, display devices are designed with various transparent conductive materials that can be used as electromagnetic wave shielding materials.

In display devices where a continuous conductive film is not practical for providing this protection from electromagnetic radiation emission, it has been found that conductive mesh or patterns can be used for this electromagnetic wave shielding purpose for example as described in U.S. Pat. No. 7,934,966 (Sasaki et al.).

Other technologies have been developed to provide new microfabrication methods to provide metallic, two-dimensional, and three-dimensional structures with conductive metals. Patterns have been provided for these purposes using photolithography and imaging through mask materials as described for example in U.S. Pat. No. 7,399,579 (Deng et al.).

Improvements have been proposed for providing conductive patterns using photosensitive silver salt compositions such as silver halide emulsions as described for example in U.S. Pat. No. 8,012,676 (Yoshiki et al.). Such techniques have a number of disadvantages that are described in this patent and the efforts continue to make additional improvements.

In addition, as the noted display devices have been developed in recent years, attraction has increased greatly for the use of touch screen technology whereby a light touch on the screen surface with a finger or stylus can create signals to cause changes in screen views or cause the reception or sending of information, telecommunications, interaction with the internet, and many other features that are being developed at an ever-increasing pace of innovation. The touch screen technology has been made possible largely by the use of transparent conductive grids on the primary display so that the location of the noted touch on the screen surface can be detected by appropriate electrical circuitry and software.

For a number of years, touch screen displays have been prepared using indium tin oxide (ITO) coatings to create arrays of capacitive patterns or areas used to distinguish multiple point contacts. ITO can be readily patterned using known semiconductor fabrication methods including photolithography and high vacuum processing. However, the use of ITO coatings has a number of disadvantages. Indium is an expensive rare earth metal and is available in limited supply. Moreover, ITO is a ceramic material and is not easily bent or flexed and such coatings require expensive vacuum deposition methods and equipment. In addition, ITO conductivity is relatively low, requiring short line lengths to achieve desired response rates (upon touch). Touch screens used in large displays are broken up into smaller segments in order to reduce the conductive line length to provide acceptable electrical resistance. These smaller segments require additional driving and sensing electronics, further adding to the cost of the devices.

Silver is an ideal conductor having conductivity that is 50 to 100 times greater than that of ITO. Unlike most metal oxides, silver oxide is still reasonably conductive and its use reduces the problem of making reliable electrical connections. Moreover, silver is used in many commercial applications and is available from numerous commercial sources.

In other technologies, transparent polymeric films have been treated with conductive metals such as silver, copper, nickel, and indium by such methods as sputtering, ion plating, ion beam assist, wet coating, as well as the vacuum deposition. However, all of these technologies are expensive, tedious, or extremely complicated so that the relevant industries are spending considerable resources to design improved means for forming conductive patterns for various devices especially touch screen displays.

A similar level of transparency and conductivity for patterns can be achieved by producing very fine lines of about 5-6 μm in width of highly conductive material such as copper or silver metal or conductive polymers. There is a need for a way to make thin conductive lines using less expensive materials and plating techniques in order to achieve a substantial improvement in cost, reliability, and availability of conductive patterns for various display devices. The present invention addresses this need as described in considerable detail below.

SUMMARY OF THE INVENTION

The present invention provides a method for using the reactive polymers described herein to address some of the noted problems.

The present invention provides a method for forming a pattern in a polymeric layer, the method comprising:

providing a polymeric layer comprising a reactive composition that comprises:

(a) a reactive polymer comprising -A- recurring units comprising pendant tertiary alkyl ester groups in an amount of at least 25 mol %, based on total (a) reactive polymer recurring units, (b) a compound that provides an acid upon exposure to radiation having a $\lambda_{max}$ of at least 150 nm and up to and including 450 nm, which acid has a pKa of less than 2 as measured in water, (c) a crosslinking agent that is capable in the reacting in the presence of the acid provided by the (b) compound to provide crosslinking in the (a) reactive polymer, and (d) optionally, a photosensitizer, patternwise exposing the polymeric layer to radiation having a $\lambda_{max}$ of at least 150 nm and up to and including 450 nm, to provide a polymeric layer comprising non-exposed regions and exposed regions comprising a polymer comprising carboxylic acid groups, optionally heating the polymeric layer simultaneously with or after patternwise exposing the polymeric layer but before contacting the exposed regions of the polymeric layer with electroless seed metal ions at a temperature sufficient to generate carboxylic acid groups in the (a) reactive polymer in the exposed regions of the polymeric layer, contacting the exposed regions of the polymeric layer with electroless seed metal ions to form a pattern of electroless seed metal ions in the exposed regions of the polymeric layer, optionally contacting the pattern of electroless seed metal ions in the exposed regions of the polymeric layer with a non-reducing reagent that reacts with the electroless seed metal ions to form an electroless seed metal compound that has a $pK_{sp}$ of less than 40, and electrolessly plating the bound electroless seed metal compound in the exposed regions of the polymeric layer with a metal that is the same as or different from the metal that is within the bound electroless seed metal compound.

This invention can also provide an intermediate article comprising a substrate and having disposed thereon a polymeric layer comprising exposed regions and non-exposed regions, the exposed regions comprising a pattern of an electroless seed metal compound comprising a non-reducing reagent in a de-blocked and crosslinked polymer derived from (a) reactive polymer comprising -A- recurring units comprising pendant tertiary alkyl ester groups in an amount of at least 25 mol %, based on total (a) reactive polymer recurring units, wherein the electroless seed metal compound has a $pK_{sp}$ of less than 40, and the non-exposed regions comprising a reactive composition that comprises:

the (a) reactive polymer comprising -A- recurring units comprising pendant tertiary alkyl ester groups in an amount of at least 25 mol %, based on total (a) reactive polymer recurring units, (b) a compound that provides an acid upon exposure to radiation having a $\lambda_{max}$ of at least 150 nm and up to and including 450 nm, which acid has a pKa of less than 2 as measured in water, (c) a crosslinking agent that is capable in the presence of the acid provided by the (b) compound to provide crosslinking in the (a) reactive polymer, and (d) optionally, a photosensitizer.

The present invention provides a method for forming conductive metal patterns using a specifically designed reactive polymer in combination with an acid providing compound and a crosslinking agent. The reactive polymer can undergo one or more chemical reactions in the presence of the generated strong acid (pKa of less than 2) to provide reactive sites that will complex with catalytic metal ions such as silver ions or palladium ions. The chemical reactions also increase the hydrophilicity of exposed regions to allow diffusion of hydrophilic compounds such as aqueous metal ions, dyes, non-reducing reagents, and reducing agents and to promote strong adhesion of the polymeric layer to a substrate using crosslinking to minimize dissolution in various aqueous-based baths, solutions, or dispersions used in electroless plating methods.

The necessary pendant carboxylic acid groups are generated in the reactive polymer in the presence of the strong acid generated during exposure for example to ultraviolet light. The pendant carboxylic acid groups increase the hydrophilicity of the polymer and are available to complex or react with metal ions and take part in crosslinking reactions within the reactive composition of the polymeric layer.

The present invention avoids the use of known expensive high vacuum processes necessary for making conductive patterns using indium tin oxide (ITO) coatings and is more readily carried out using high-speed roll-to-roll machines to provide higher manufacturing efficiencies.

DETAILED DESCRIPTION OF THE INVENTION

Definitions

As used herein to define various ethylenically unsaturated polymerizable monomer components of the reactive polymers, aqueous-based solutions, reactive compositions, and polymeric layers, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, or layer. Unless otherwise indicated, the percentages can be the same for either a dry layer or pattern, or for the total solids of the formulation or composition.

The term "homopolymer" is meant to refer to reactive polymers that have the same repeating or recurring unit along a reactive polymer backbone. The term "copolymer" refers to polymers composed of two or more different repeating or recurring units that are arranged randomly along the reactive polymer backbone.

For reactive polymers used in the present invention, the term "arranged randomly" means that blocks of recurring units are not intentionally incorporated into the reactive polymers, but that recurring units are incorporated into the backbone in a random fashion using known polymerization procedures that do not encourage the formation of block copolymers.

Recurring units in reactive polymers described herein are generally derived from the corresponding ethylenically unsaturated polymerizable monomers used in a polymerization process, which ethylenically unsaturated polymerizable monomers have the desired pendant groups. Alternatively, pendant groups can be formed or modified within recurring units after polymerization of ethylenically unsaturated polymerizable monomers having requisite precursor pendant groups.

The term "reactive polymer" is used herein to refer to the polymers described below that comprise at least one pendant labile group that can be changed, such as de-blocked (or unblocked), during appropriate irradiation in the presence of the (b) compound that can generate an acid during irradiation, to provide a pendant ionic group such as a pendant carboxylic acid group. The (b) compound can be considered a "photoacid generating compound" that absorbs appropriate radiation and undergoes suitable reaction or decomposition to release the described acid having a pKa of less than 2 as measured in water. As described above, the de-blocked polymer in the reactive composition then becomes crosslinked.

The term "aqueous-based" refers to solutions, baths, or dispersions in which the predominant solvent, or at least 50 weight % of the solvents, is water.

Reactive Polymers for Pattern Formation

In general, the reactive polymers useful in the practice of this invention have two essential features: (1) they have labile groups that upon exposure to suitable radiation are de-blocked and provide hydrophilic groups such as pendant ionic groups including but not limited to carboxylic acid groups, and (2) upon such irradiation, they are capable of being crosslinked only in exposed regions. While the reactive polymers can be supplied as solutions in appropriate solvents, they are best used when applied to a substrate that can be a large or small surface, including the outer surfaces of inorganic or organic particles and then dried.

The reactive polymers can be either condensation or vinyl polymers as long as the requisite pendant carboxylic groups are connected to the polymer backbone. In most embodiments, the useful reactive polymers are vinyl polymers derived from one or more ethylenically unsaturated polymerizable monomers using suitable polymerization procedures including solution and emulsion polymerization techniques using appropriate initiators, surfactants, catalysts, and solvents, all of which would be readily apparent to one skilled in the art from the teaching provided herein.

The useful reactive polymers generally comprise at least some recurring units that comprise pendant groups attached to the polymer backbone, which pendant groups comprise a labile ester such as a labile ester of a carboxylic acid as described below. The term "labile" means that the labile carboxylic acid esters can provide the corresponding pendant carboxylic acid groups upon de-blocking when the (a) reactive polymer and (b) compound are exposed to radiation having a $\lambda_{max}$ of at least 150 nm and up to and including 450 nm, or more likely exposed to radiation having a $\lambda_{max}$ of at least 150 nm and up to and including 250 nm (sometimes known as "short UV"). Prior to the noted irradiation (and optional heating described below), the labile carboxylic acid esters are considered "blocked" and are not available for reaction or causing reaction.

The reactive polymers useful in the present invention can become de-blocked and crosslinked during the noted irradiation and generation of the pendant carboxylic acid groups. As noted in more detail below, the (c) crosslinking compound that provides crosslinking in the reactive polymer can be part of the reactive polymer and arranged along the polymer backbone. Alternatively, the (c) crosslinking compound is a distinct compound dispersed within the polymeric layer (described below).

Once suitable pendant carboxylic acid groups are generated, the resulting polymer can become either more water-soluble or water-insoluble in irradiated or exposed regions of the polymeric layer, depending upon the extent of crosslinking in the resulting polymeric layer.

The most useful (a) reactive polymers can be addition polymers comprising pendant labile tertiary alkyl ester groups that are each covalently attached to the polymer backbone. Such (a) reactive polymer embodiments are addition polymers comprising an all carbon backbone and -A- recurring units randomly forming this backbone, which -A- recurring units comprise the pendant labile tertiary alkyl ester groups.

Such pendant labile tertiary alkyl ester groups can be indirectly or directly attached to the (a) reactive polymer backbone, such as an all carbon backbone derived from one or more ethylenically unsaturated polymerizable monomers that are incorporated using free radical solution polymerization. For example, such pendant labile tertiary alkyl ester groups can be provided in ethylenically unsaturated polymerizable monomers including but not limited to, appropriate acrylates and methacrylates that can also comprise other functional groups as part of the backbone or as pendant groups. In most embodiments, the pendant labile tertiary alkyl ester groups are directly attached to the carbon-carbon (a) reactive polymer backbone.

A tertiary alkyl ester group in useful ethylenically unsaturated polymerizable monomers can be a tertiary alkyl group having 4 to 8 carbon atoms, including but not limited to, a tertiary alkyl ester group having 4 carbon atoms (t-butyl), 5 carbon atoms (t-pentyl or 1,1-dimethylpropyl), 6 carbon atoms (t-hexyl, 1,1-dimethyl-t-butyl, or 1,1-dimethyl-iso-butyl) in the alkyl moiety of the alkyl ester group. An acrylate or methacrylate monomer comprising pendant t-butyl ester groups (t-boc) are particularly useful for making the (a) reactive polymers.

In general, this tertiary alkyl ester group can be represented by the formula: —C(=O)O-t-alkyl wherein the t-alkyl represents the tertiary alkyl group (branched or linear, substituted or unsubstituted) having 4 to 8 carbon atoms. This tertiary alkyl ester group can be directly attached (single bond) to a carbon atom of the all carbon polymer backbone, or it can be attached through a divalent linking group "L" that can be a substituted or unsubstituted arylene or alkylene group, or combination thereof, and which divalent linking group can also include one or more heteroatoms (oxygen, sulfur, or nitrogen) in the linking chain having appropriate filled valences.

In some embodiments, the (a) reactive polymer is a polymer comprising only recurring units that comprise the same or different pendant labile tertiary alkyl ester groups (derived from two or more of the noted ethylenically unsaturated polymerizable monomers). Thus, such reactive polymers are homopolymers comprising the same recurring units, or copolymers comprising a mixture of recurring units that have different pendant labile tertiary alkyl ester groups.

However, in other embodiments, the (a) reactive polymer is a copolymer comprising various additional recurring units that are different from the -A- recurring units and that can give the (a) reactive polymer specific properties, such as crosslinking capabilities, hydrophilicity, or changing of thermal properties. Useful additional recurring units are described in the following paragraphs, including the -B- recurring units that can provide crosslinking as the (c) crosslinking agent, the -C- recurring units, or combinations of both -B- and -C- recurring units. In such copolymers, the various types of recurring units are arranged to form the polymer backbone in a random fashion although there can be small blocks of the same recurring units that occur without design.

For example, the (a) reactive polymer can also be a copolymer comprising -A- recurring units that comprise the same or different pendant labile tertiary alkyl ester groups, as described above, -B- recurring units comprising pendant groups that provide crosslinking groups in the presence of the acid generated from the (b) compound upon exposure to radiation having a $\lambda_{max}$ of at least 150 nm and up to and including 450 nm, which acid has a pKa of less than 2 when measured in water. These -B- recurring units can represent the (c) crosslinking agent although additional (c) crosslinking agents that are not part of the reactive polymer can be provided in the polymeric layer.

The -A- recurring units are generally present in the (a) reactive polymer in an amount of at least 25 mol %, or even at least 50 mol %, and up to and including 100 mol %, based on total recurring units in the (a) reactive polymer. In most useful embodiments, the -A- recurring units are present in an amount of at least 50 mol % and up to and including 98 mol %, or at least 70 mol % and up to and including 98 mol %, or even at least 80 mol % and up to and including 95 mol %, based on total recurring units in the (a) reactive polymer.

When present in the (a) reactive polymer, the -B- recurring units are derived from any suitable ethylenically unsaturated polymerizable monomer, or group of monomers, having the same or different group that is capable of providing acid-catalyzed crosslinking during irradiation. For example, the -B- recurring units can comprise pendant groups that comprise an epoxy group (such as a glycidyl group), aziridinyl, or epithiopropyl group. Particularly useful -B- recurring units comprise pendant crosslinkable epoxy groups such as glycidyl groups and can be derived from glycidyl methacrylate or glycidyl acrylate. Other useful ethylenically unsaturated polymerizable monomers that have acid-catalyzed crosslinking groups would be readily apparent to one skilled in the art.

Such -B- recurring units can be present in an (a) reactive polymer of this invention in an amount of at least 2 mol % and up to but not including 75 mol %, or at least 2 mol % and up to and including 50 mol %, or at least 5 mol % and up to and including 30 mol %, based on the total recurring units in the (a) reactive polymer. A skilled worker can use the appropriate amount of the -A- and -B- recurring units to provide the desired results (including sufficient crosslinking) while allowing sufficient diffusion of the catalyst-forming and metal plating reactants into the polymeric layer.

In addition to the -A- and -B- recurring units described above, the (a) reactive polymers can further comprise one or more additional recurring units that are different from all -A- and -B- recurring units, herein identified as -C- recurring units. A skilled polymer chemist would understand how to choose such additional -C- recurring units, and for example, they can be derived from one or more ethylenically unsaturated polymerizable monomers selected from the group consisting of alkyl acrylates (including benzyl acrylate), alkyl methacrylates (including benzyl methacrylate), (meth)acrylamides, styrene and styrene derivatives, vinyl imides, and mixtures thereof. It is apparent that the -C- recurring units can have pendant substituted or unsubstituted alkyl groups (including substituted or unsubstituted benzyl groups), substituted or unsubstituted aryl groups (such as substituted or unsubstituted phenyl groups), alkyl ester groups, or aryl ester groups. Many useful -C- recurring units comprise alkyl ester groups wherein the alkyl moiety has 1 to 7 carbon atoms and is linear, branched, or cyclic in form, and can include benzyl ester groups.

When present, the additional -C- recurring units can be present in the (a) reactive polymer in an amount adequate to provide desired properties, for example at least 1 mol % and up to and including 50 mol %, or at least 5 mol % and up to and including 25 mol %, based on the total recurring units in the (a) reactive polymer.

The mol % amounts of the various recurring units defined herein for the (a) reactive polymers are meant to refer to the actual molar amounts present in the (a) reactive polymers. It is understood by one skilled in the art that the actual mol % values may differ from those theoretically possible from the amount of ethylenically unsaturated polymerizable monomers that are used in the polymerization procedure. However, under most polymerization conditions that allow high polymer yield and optimal reaction of all monomers, the actual mol % of each monomer is generally within ±15 mol % of the theoretical amounts.

In such (a) reactive polymers, the relatively molar amounts of -A-, -B-, and -C- recurring units can be adjusted and optimized using routine experimentation so that the polymeric layers used in the methods of this invention will provide satisfactory patterns and will not dissolve in the various solutions used in the electroless plating methods. In addition, it is useful to avoid too much crosslinking in the (a) reactive polymer that reduces the diffusion of various reactants (for example, reducing agents) into the polymeric layer.

Particularly useful embodiments of (a) reactive polymers include but are not limited to (molar ratios are theoretical based on amounts of monomers added to reaction solution):

poly(t-butyl methacrylate-co-glycidyl methacrylate) (80:20);

poly(t-butyl methacrylate-co-glycidyl methacrylate) (90:10);

poly(t-butyl acrylate-co-glycidyl methacrylate) (90:10);

poly(t-butyl methacrylate-co-glycidyl methacrylate) (85:15);

poly(t-butyl methacrylate-co-glycidyl methacrylate) (95:5);

poly(t-butyl methacrylate-co-glycidyl methacrylate-co-n-butyl methacrylate) (70:20:10);

poly(t-butyl methacrylate-co-glycidyl methacrylate-co-n-butyl acrylate) (80:10:10), poly(t-butyl methacrylate-co-glycidyl methacrylate-co-benzyl methacrylate) (90:5:5), and poly(t-butyl methacrylate-co-glycidyl methacrylate-co-stearyl methacrylate) (90:5:5).

The (a) reactive polymers generally have a molecular weight (MO of at least 10,000 and up to and including 500,000 as measured by gel permeation chromatography (GPC) or by size exclusion chromatography (SEC).

Examples of (a) reactive polymers can be prepared using known free radical solution polymerization techniques using known starting materials, free radical initiators, and reaction conditions in suitable organic solvents such as tetrahydrofuran that can be adapted from known polymer chemistry. Where starting materials (such as ethylenically unsaturated polymerizable monomers) are not available commercially, such starting materials can be synthesized using known chemical starting materials and procedures.

A representative preparation of particularly useful (a) reactive polymer embodiment is provided below for use in the Invention Examples described below.

Reactive Compositions:

The (a) reactive polymers described herein can be used in reactive compositions in various methods for forming conductive patterns for example using electroless plating.

Each of these reactive compositions has only three essential components: the (a) reactive polymer described above, a (b) compound that provides an acid upon exposure to radiation having a $\lambda_{max}$ of at least 150 nm and up to and including 450 nm, as described below, and (c) a crosslinking agent as described below. While various optional components can be included as described below, only these essential components are needed for providing the desired pattern in the reactive composition forming the polymeric layer.

One or more (a) reactive polymers as described above are generally present in the reactive composition (and in the resulting dry polymeric layer) in an amount of at least 50 weight % and up to and including 97 weight %, or typically at least 80 weight % and up to and including 95 weight %, based on the total solids in the reactive composition (or dry polymeric layer weight).

The (b) compounds used in the present invention provide an acid having a pKa of less than 2 or typically a pKa less than 0, as measured in water, during the noted exposure to radiation. The (b) compounds generally absorb radiation having a $\lambda_{max}$ of at least 150 nm and up to and including 450 nm, or typically radiation having a $\lambda_{max}$ of at least 150 nm and up to and including 330 nm. Upon such exposure, the (b) compound converts the tertiary alkyl ester group in the (a) reactive polymer to a corresponding carboxylic acid (for example, converting a t-butyl ester to carboxylic acid) and promotes crosslinking within the (a) reactive polymer.

Particularly useful (b) compounds are onium salts that decompose upon irradiation. An onium salt (also known as an onium compound) is a compound that is formed by the attachment of a proton to a mononuclear parent hydride of a Group 15 element (for example nitrogen and phosphorus), a chalcogen of Group 16 (for example sulfur and selenium), or a halogen (such as fluorine, chlorine, and iodine). Particularly useful (b) compounds include but are not limited to, onium salts such as sulfonium salts, phosphonium salts, iodonium salts, aryldiazonium salts, and other acid-generating compounds such as nitrobenzyl esters as described for example in U.S. Pat. No. 5,200,544 (Houlihan et al.) and oximes of sulfonates as described in U.S. Pat. No. 7,749,677 (Ando). The sulfonium salts, phosphonium salts, and iodonium salts are particularly useful, including but not limited to the arylsulfonium salts and aryliodonium salts that can provide an acid having a pKa less than 2, or even less than 0, as measured in water.

Useful onium salts have substituted or unsubstituted alkyl or aryl groups and strong acid anions such as hexafluorophosphate, tetrafluoroborate, hexafluoroarsenate, hexafluoroantimonate, and trifluoromethylsulfonate (triflate). Representative examples of useful onium salts include triarylsulfonium and biaryl iodonium salts such as triphenylsulfonium triflate, (4-methylphenyl)diphenylsulfonium triflate, (4-t-butyphenyl)diphenylsulfonium triflate, 4-methoxyphenyl)diphenylsulfonium triflate, and bis(4-t-butylphenyl)iodonium triflate.

One or more (b) compounds described herein are generally present in the reactive composition (and dry polymeric layer) in an amount of at least 2 weight % and up to and including 40 weight %, or more likely at least 5 weight % and up to and including 20 weight %, based on the total solids in the reactive composition (or dry polymeric layer weight).

The reactive composition also includes one or more (c) crosslinking agents. In many embodiments, the (c) compound can be part of the (a) reactive polymer, for example as -B- recurring units as described above and in the described molar amounts. In other embodiments, the (c) crosslinking agent is a compound (or group of compounds) distinct from the (a) reactive polymers. In other words, these (c) compounds are not attached to or complexed with the (a) reactive polymer. Such (c) compounds are capable of reacting with the pendant carboxylic acid groups generated from the pendant tertiary alkyl ester groups in the (a) reactive polymer in the presence of the acid provided by the (b) compound described above.

Some useful (c) crosslinking agents that are not part of the (a) reactive polymer include but are not limited to, melamine formaldehyde resins, glycoluril formaldehyde resins, polycarboxylic acids and anhydrides, polyamines, epihalohydrins, diepoxides, dialdehydes, diols, carboxylic acid halides, ketenes, aziridines, carbodiimides, isocyanates, and mixtures thereof. Such (c) crosslinking agents can be present in the reactive composition in an amount of at least 1 weight % and up to and including 30 weight %, or more typically at least 2 weight % and up to and including 15 weight %, based on the total solids in the reactive composition. The particular useful amount can be determined in view of the particular (c) crosslinking agent and specific (a) reactive polymer that is used.

While not essential, it can be desirable to enhance the sensitivity of some (b) compounds to longer wavelengths (for example, greater than 300 nm) by including one or more (d) photosensitizers in the reactive compositions used in this invention. A variety of photosensitizers are known in the art such as aromatic tertiary amines, aromatic tertiary diamines and certain aromatic polycyclic compounds such as substituted or unsubstituted anthracene compounds, as described for example in U.S. Pat. No. 4,069,054 (Smith) and U.S. Pat. No. 7,537,452 (Dede et al.). Particularly useful photosensitizers include unsubstituted anthracene and substituted anthracenes such as 9,10-diethoxyanthracene and 2-t-butyl-9,10-diethoxyanthracene.

One or more photosensitizers can be optionally present in the reactive composition (and dry polymeric layer) in an amount of at least 1 weight % and up to and including 30 weight %, or more likely at least 5 weight % and up to and including 15 weight %, based on the total solids in the reactive composition (or dry polymeric layer weight).

The reactive compositions can optionally include one or more addenda such as film-forming compounds, surfactants, plasticizers, filter dyes, viscosity modifiers, high boiling solvents that are compatible with the (a) reactive polymer (such as phthalated esters including dibutyl phthalate and dioctyl phthalate), and any other optional components that would be readily apparent to one skilled in the art, and such addenda can be present in amounts that would also be readily apparent to one skilled in the art.

The essential (a) reactive polymer, (b) compound, and (c) crosslinking agent, and the optional (d) compound described above are generally dissolved in a suitable organic solvent (or mixture of organic solvents) to form a reactive composition that can be applied to a suitable substrate (described below). Useful organic solvents include but are not limited to, ketones such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

Articles

The reactive composition described above can be applied to a suitable substrate using any suitable method including but not limited to, spin coating, bead coating, blade coating, curtain coating, or spray coating, from a suitable reservoir to form a polymeric layer. Useful substrates can be chosen for particular use or method as long as the substrate material will not be degraded by the reactive composition or any treatments to which the resulting precursor articles are subjected during the methods of this invention. The reactive composition can be applied multiple times if desired to obtain a thicker coating (reactive layer) of the reactive composition, and dried between each coating or dried only after the last application. Solvent can be removed from the reactive composition using any suitable drying technique.

In general the final dry coating of reactive composition can have an average dry thickness of at least 10 nm and up to and including 10 mm, with a dry thickness of at least 0.1 µm and up to and including 100 µm being more useful. The average dry thickness can be determined by measuring the dry layer thickness in at least 10 different places within a 10 cm by 10 cm square of the dry reactive layer using an electron microscope or other suitable diagnostic device.

Thus, useful substrates can be composed of glass, quartz, and ceramics as well as a wide variety of flexible materials such as cellulosic papers and polyesters including poly(ethylene terephthalate) and poly(ethylene naphthalate), polycarbonates, polyamides, poly(meth)acrylates, and polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 µm and up to and including 10 mm, depending upon the intended use of the resulting articles.

Particularly useful substrates are composed of poly(ethylene terephthalate) such as biaxially oriented poly(ethylene terephthalate) (PET) films that have broad uses in the electronics market. These PET films, ranging in dry thickness of at least 50 µm and up to and including 200 µm, can also comprise, on at least one side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylics, as well as sub-micrometer silica particles. The dry thickness of the primer layer can be at least 0.1 µm and up to and including 1 µm.

Thus, with the application of the described reactive composition to a suitable substrate, with or without appropriate drying, the present invention provides a precursor article comprising a substrate and having disposed thereon a polymeric layer comprising a reactive composition that comprises:

(a) a reactive polymer comprising -A- recurring units comprising pendant tertiary alkyl ester groups in an amount of at least 25 mol %, based on total (a) reactive polymer recurring units, (b) a compound that provides an acid upon exposure to radiation of at least 150 nm and up to and including 450 nm, which acid has a pKa of less than 2 as measured in water, (c) a crosslinking agent that is capable of reacting in the presence of the acid provided by the (b) compound to provide crosslinking in the (a) reactive polymer, and (d) optionally, a photosensitizer.

Uses of Reactive Compositions

The reactive compositions described herein can be used to form surface patterns for various purposes as described above. The following discussion provides some details about representative electroless plating methods in which the reactive compositions can be used.

In these electroless plating methods, each aqueous-based "processing" solution, dispersion, or bath (for example, solutions containing electroless seed metal ions, non-reducing agent solutions, and solutions for electroless plating, as well as rinsing solutions) used at various points can be specifically designed with essential components as well as optional addenda that would be readily apparent to one skilled in the art. For example, one or more of those aqueous-based processing solutions can include such addenda as surfactants, anti-coagulants, anti-corrosion agents, anti-foamants, buffers, pH modifiers, biocides, fungicides, and preservatives. The aqueous-based reducing solutions can also include suitable antioxidants.

The method of this invention for forming a pattern in a polymeric layer, comprises:

providing a polymeric layer (as in forming the described precursor article), the polymeric layer comprising the reactive composition described above, comprising (a) reactive polymer, (b) compound that provides an acid, (c) crosslinking agent, and optionally (d) photosensitizer, all as described above. This polymeric layer can be formed on a suitable substrate, if desired, as described above by suitable application of the reactive composition, after which the reactive composition is typically dried before the resulting article is used in the method of this invention.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, to provide a polymeric layer comprising non-exposed regions and exposed regions comprising a polymer comprising pendant carboxylic acid groups. This exposure can be provided with any suitable exposing source or device that provides the desired radiation including but not limited to, various arc lamps and LED sources. The particular exposing source can be chosen depending upon the absorption characteristics of the particular reactive composition used. The exposing radiation can be projected through a lens or mask element that can be in physical contact or in proximity (not in physical contact) with the outer surface of the polymeric layer. Exposure time can range from a fraction (0.1) of a second and up to and including 10 minutes depending upon the intensity of the radiation source and the reactive compositions. Suitable masks can be obtained by known methods including but not limited to photothermographic methods, flexographic methods, or vacuum deposition of a chrome mask onto a suitable substrate such as quartz or high quality optical glass.

It is optional but desirable to heat or bake the polymeric layer in the precursor article simultaneously with or after the patternwise exposure but generally before contacting the exposed polymeric layer with electroless seed metal ions (described below). In most embodiments, this heating is carried out at least after the patternwise exposure of the polymeric layer, but it can be carried out both during and after the patternwise exposure of the polymeric layer. The heating is generally at a temperature in the range of or exceeding the glass transition temperature of the polymeric layer [that is similar to or the same as the glass transition temperature of the (a) reactive polymer]. Such heating can be accomplished on a hot plate with vacuum suction to hold the precursor article in close contact with the heating surface. Alternatively, the heating device can be a convection oven. The glass transition temperatures of the (a) reactive polymers useful in the practice of this invention can generally range from at least 50° C. and up to and including 180° C. Thus, polymeric layer can be heated at a temperature of less than 200° C. particularly if a plasticizer is present in the reactive composition. The duration of the heating procedure is generally less than 10 minutes with heating for least 10 seconds and up to and including 5 minutes being most likely. After the heating procedure, a faint image may be observable in the exposed regions of the polymeric layer due to the change in the index of refraction or physical contraction or expansion of the chemically altered (a) reactive polymer. The optimal heating time and temperature can be readily determined with routine experimentation depending upon the particular reactive composition.

At any time after the patternwise exposing or optional heating procedures, the reactive composition remaining in the non-exposed regions of the polymeric layer can be removed using an organic solvent in which the polymeric layer comprising the reactive composition is soluble or dispersible. In such procedures at least 50 weight % and typically at least 80 weight % or even at least 90 weight % of the reactive composition is removed in the non-exposed regions, based on the total amount of reactive composition originally present in the non-exposed regions. Upon this removal of reactive composition from the non-exposed regions of the polymeric layer, the various articles described herein will contain de-blocked and crosslinked reactive polymer in the exposed regions of the polymeric layer, along with non-reducing reagent molecules, electroless seed metal ions, electroless seed metal nuclei, or electroless plated metal, depending upon the stage at which the non-exposed reactive composition has been removed.

The removal procedure can be carried out in any suitable manner, including immersion of the intermediate article into a suitable organic solvent or mixture of organic solvents or by spraying the organic solvent or mixture of organic solvents onto the intermediate article surface. Contact with the organic solvent (or mixture thereof) can be carried out for a suitable time and temperature so that reactive composition is desirably removed in the non-exposed regions but little removal (less than 10 weight % of the total material) occurs in the exposed regions of the polymeric layer containing the crosslinked reactive polymer. For example, the contact time can be at least 10 seconds and up to and including 10 minutes, and the contact temperature can be at room temperature (about 20° C.) and up to and including 50° C.

Organic solvents that can used for this purpose include but are not limited to ketones, such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

In many embodiments, removing the reactive composition in the non-exposed regions of the polymeric layer is carried out immediately after the patternwise exposure and any optional heating procedure.

At this point, an intermediate article has been created in which the exposed regions of the polymeric layer on the substrate comprise de-blocked and crosslinked polymer derived from the (a) reactive polymer in the reactive composition described above, and the non-exposed regions of the polymeric layer comprise little or no reactive composition.

Once patternwise exposure and optional heating have been carried out, the exposed regions of the polymeric layer are contacted with electroless seed metal ions to form coordinated electroless seed metal ions in the exposed regions of the polymeric layer. These electroless seed metal ions form catalytic sites for electroless metal plating (deposition of metal). There are various ways that this contacting can be carried out. Typically, the entire precursor article is immersed within a dilute aqueous-based solution, bath, or dispersion of the electroless seed metal ions for a sufficient time to coordinate the optimum number of electroless seed metal ions within the exposed regions of the polymeric layer. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given polymeric layer and electroless seed metal ions that are to be used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that can have an overall positive, negative, or neutral charge). Useful materials of this type include but not limited to, metal salts and metal-ligand complexes of nitrates, halides, acetates, cyanides, amines, nitriles, thiocyanates, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions.

The contact with the electroless seed metal ions produces an intermediate article comprising a substrate and having disposed thereon a polymeric layer comprising exposed regions and non-exposed regions, the exposed regions comprising a pattern of electroless seed metal ions within the de-blocked and crosslinked polymer resulting from the irradiation of the (a) reactive polymer in the reactive composition described herein, and the non-exposed regions comprising the reactive composition described herein comprising (a) reactive polymer, (b) a compound that provides an acid, (c) crosslinking agent, and (d) optionally, a photosensitizer, all as described above.

After the requisite time to react the electroless seed metal ions within with the de-blocked and crosslinked polymer in the exposed regions, the polymeric layer can be rinsed with distilled or deionized water or another aqueous-based solution for a suitable time and at a suitable temperature, for example usually room temperature or slightly higher.

Optionally at this point, the reactive composition can be removed from the non-exposed regions of the polymeric layer as described above, leaving the pattern of electroless seed metal ions in the exposed regions of the polymeric layer containing the de-blocked and crosslinked polymer derived from the (a) reactive polymer in the reactive composition described above.

If this procedure is carried out, an intermediate article is created that comprises a substrate and having disposed thereon exposed regions of the polymeric layer containing a de-blocked and crosslinked polymer derived from the (a) reactive polymer in the reactive composition described above, and non-exposed regions of the polymeric layer comprising little or no reactive composition, wherein the exposed regions further comprise a pattern of electroless seed metal ions coordinated within the de-blocked and crosslinked polymer.

The electroless seed metal ions in the exposed regions of the polymeric layer are then contacted with a non-reducing reagent that reacts with the electroless seed metal ions to form an electroless seed metal compound (containing the non-reducing reagent) deposited within the exposed regions of the polymeric layer containing the de-blocked and crosslinked polymer derived from the (a) reactive polymer in the reactive composition described above.

Useful non-reducing reagents include any compound that will covalently, ionically, or otherwise bond to or react with the electroless seed metal ions to form the electroless seed metal compound. Useful non-reducing reagents include those that provide electroless seed metal compounds having a $pK_{sp}$ value of less than 40, and for example, a $pK_{sp}$ that is greater than 4 and less than 40. For example, such useful non-reducing reagents include but are not limited to, alkali metal and ammonium hydroxides, thiosulfates, thiocyanates, sulfites, small organic acids, and combinations thereof. Halides are also useful non-reducing reagents for this invention. Alkali metal hydroxides are particularly useful including mixtures thereof.

This contacting procedure can be carried out in various ways including immersing the intermediate article in an aqueous-based non-reducing solution comprising one or more non-reducing reagents at a concentration of at least 1 weight % based on total aqueous-based non-reducing solution weight. Alternatively, an aqueous-based non-reducing solution can be sprayed or coated onto the polymeric layer in the intermediate article. The time and temperature for this contacting would be readily apparent to one skilled in the art in order to best achieve the desired bonding. For example, the contacting can be carried out at room temperature (about 20° C.) and up to and including 95° C. and the time can be for at least 1 second and up to and including 30 minutes.

After this contact with the non-reducing reagent, the polymeric layer, especially the exposed regions, can be again washed using distilled water or deionized water or another aqueous-based solution under suitable conditions of time and temperature.

At this stage, another intermediate article has been created, which intermediate article comprises a substrate and having disposed thereon a polymeric layer comprising exposed regions and non-exposed regions, the exposed regions of the polymeric layer comprising a pattern of an electroless seed metal compound (comprising a non-reducing reagent as described above) and a de-blocked and crosslinked polymer derived from the (a) reactive polymer in the reactive composition described above, and the non-exposed regions comprising a reactive composition described herein comprising (a) reactive polymer, (b) compound that provides an acid, (c) crosslinking agent, and (d) optionally, a photosensitizer, all as described above.

Optionally at this point, the reactive composition can be removed from the non-exposed regions of the polymeric layer as described above, leaving the pattern of electroless seed metal compound in the exposed regions of the polymeric layer containing the de-blocked and crosslinked polymer derived from the (a) reactive polymer in the reactive composition described above.

If this procedure is carried out, an intermediate article is created that comprises a substrate and having disposed thereon exposed regions of the polymeric layer containing a de-blocked and crosslinked polymer derived from the (a) reactive polymer in the reactive composition described above, and non-exposed regions of the polymeric layer comprising little or no reactive composition, wherein the exposed regions further comprise a pattern of electroless seed metal compound (comprising the non-reducing compound as described above).

This intermediate article can be immediately immersed in an aqueous-based electroless metal plating bath or solution, or the intermediate article can be stored with just the catalytic pattern comprising electroless seed metal compound for use at a later time.

The intermediate article can be contacted with an electroless plating metal that is the same as or different from the metal within the electroless seed metal compound. In most embodiments, the electroless plating metal is a different metal from the metal within the electroless seed metal compound.

Any metal that will likely electrolessly "plate" on the electroless seed metal compound can be used at this point, but in most embodiments, the electroless plating metal can be for example copper(II), silver(I), gold(IV), palladium(II), platinum(II), nickel(II), chromium(II), and combinations thereof. Copper(II), silver(I), and nickel(II) are particularly useful electroless plating metals.

The one or more electroless plating metals can be present in an aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electraless Plating: Fundamentals and Applications* 1990.

After the electroless plating procedure, the product article is removed from the aqueous-based electroless plating bath or solution and can again be washed using distilled water or deionized water or another aqueous-based solution to remove any residual electroless plating chemistry or onium salts. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of an electroless seed metal compound (comprising a non-reducing reagent as described above) which has been electrolessly plated with the same or different metal that is part of the electroless seed metal compound within a de-blocked and crosslinked polymer derived from the (a) reactive polymer in the reactive composition described above, and the non-exposed regions comprising a reactive composition as described herein comprising (a) a reactive polymer, (b) compound that provides an acid, (c) a crosslinking agent, and (d) optionally, a photosensitizer, all as described above.

Optionally at this point, the reactive composition can be removed from the non-exposed regions of the polymeric layer after electrolessly plating the corresponding electroless seed metal nuclei so that the resulting article comprises a pattern of an electroless seed metal compound (comprising a non-reducing reagent as described above) that has been electrolessly plated with the same or different metal that is part of the electroless seed metal compound, within the de-blocked and crosslinked polymer derived from the (a) reactive polymer in the reactive composition described above, but the product article comprises little or no reactive composition in the non-exposed regions of the polymeric layer.

To change the surface of the electroless plated metal for visual or durability reasons, it is possible that a variety of post-treatments can be employed including surface plating of still another (third) metal such as nickel or silver on the "second" electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, is may be desirable to treat the electrolessly plated metal with a seed metal catalyst in an aqueous-based seed metal catalyst solution to facilitate deposition of additional metals.

Alternatively, the resulting product article can undergo further treated to decompose any residual onium salt on the polymeric layer or to change the visual characteristics and or durability of the electrolessly plated metal. For example, to decompose any remaining onium salt or other acid-generating (b) compound, the polymeric film can be uniformly exposed or blanket flashed with ultraviolet radiation and baked (or heated) similarly as described above after the initial exposure.

As one skilled in the art should appreciate, the individual treatments or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments, the treatment conditions or compositions can be the same or different.

In addition, multiple treatments with an aqueous-based non-reducing solution can be carried out in sequence, using the same or different non-reducing conditions and compositions. Sequential washing or rinsing steps can also be carried out where appropriate.

Further, the electroless plating procedures can be carried out multiple times, in sequence, using the same or different electroless plating metal and the same or different electroless plating conditions and times.

It is also possible to use this article comprising the noted pattern of an electrolessly plated metal to incorporate a second or more patterns in the non-exposed regions. This can be accomplished by subjecting this article to the same sequence of procedures or steps using the same or different reagents and aqueous-based solutions to provide at least a second pattern in what would be considered second exposed regions since the electrolessly plated metal would be in the what is considered the first exposed regions. The second exposed regions can comprise all of the original non-exposed regions, or they can comprise only some of the non-exposed regions.

For example, to create a second pattern in the article having the electrolessly plated metal, the article can be treated or processed as follows, using conditions and aqueous-based solutions similar to or the same as those described above:

a) patternwise exposing the previously non-exposed regions to form second exposed regions in the polymeric layer, b) optionally heating the polymeric layer, c) contacting at least the exposed regions with an aqueous-based solution containing electroless seed metal ions, and optionally rinsing, d) contacting the second exposed regions with an aqueous-based non-reducing solution, and optionally rinsing, and e) electrolessly plating the same or different metal in the exposed regions.

The present invention provides at least the following embodiments and combinations thereof, but other combinations of features are considered to be within the present invention as a skilled artisan would appreciate from the teaching of this disclosure:

1. A method for forming a pattern in a polymeric layer, the method comprising:

providing a polymeric layer comprising a reactive composition that comprises:

(a) a reactive polymer comprising -A- recurring units comprising pendant tertiary alkyl ester groups in an amount of at least 25 mol %, based on total (a) reactive polymer recurring units, (b) a compound that provides an acid upon exposure to radiation having a $\lambda_{max}$ of at least 150 nm and up to and including 450 nm, which acid has a pKa of less than 2 as measured in water, (c) a crosslinking agent that is capable of reacting in the presence of the acid provided by the (b) compound to provide crosslinking in the (a) reactive polymer, and (d) optionally, a photosensitizer, patternwise exposing the polymeric layer to radiation having a $\lambda_{max}$ of at least 150 nm and up to and including 450 nm, to provide a polymeric layer comprising non-exposed regions and exposed regions comprising a polymer comprising carboxylic acid groups, optionally heating the polymeric layer simultaneously with or after patternwise exposing the polymeric layer but before contacting the exposed regions of the polymeric layer with electroless seed metal ions at a temperature sufficient to generate pendant carboxylic acid groups in the (a) reactive polymer in the exposed regions of the polymeric layer, contacting the exposed regions of the polymeric layer with electroless seed metal ions to form a pattern of electroless seed metal ions in the exposed regions of the polymeric layer, optionally contacting the pattern of electroless seed metal ions in the exposed regions of the polymeric layer with a non-reducing reagent that reacts with the electroless seed metal ions to form an electroless seed metal compound that has a $pK_{sp}$ of less than 40, and electrolessly plating the electroless seed metal compound deposited within the exposed regions of the polymeric layer with a metal that is the same as or different from the metal that is within the bound electroless seed metal compound.

2. The method of embodiment 1, comprising contacting the exposed regions in the polymeric layer with electroless seed metal ions selected from the groups consisting of silver ions, platinum ions, palladium ions, gold ions, rhodium ions, iridium ions, nickel ions, tin ions, and copper ions.

3. The method of embodiment 1 or 2, wherein the electroless plating metal are provided as a metal salt or a metal-ligand complex.

4. The method of any of embodiments 1 to 3, comprising electrolessly plating with a metal that is selected from the group consisting of copper(II), silver(I), gold(IV), palladium(II), platinum(II), nickel(II), chromium(II), and combinations thereof.

5. The method of any of embodiments 1 to 4, further comprising heating the polymeric layer simultaneously with or immediately after patternwise exposing the polymeric layer at a temperature sufficient to generate pendant carboxylic acid groups in the (a) reactive polymer in the exposed regions of the polymeric layer.

6. The method of any of embodiments 1 to 5, comprising patternwise exposing the polymeric layer to radiation having a $\lambda_{max}$ of at least 150 nm and up to and including 330 nm.

7. The method of any of embodiments 1 to 6, comprising contacting the coordinated electroless seed metal ions in the exposed regions with the non-reducing agent that is a hydroxide, thiosulfate, carboxylate, or a combination thereof.

8. The method of any of embodiments 1 to 7, wherein the electroless seed metal compound has a $pK_{sp}$ of at least 4 and less than 40.

9. The method of any of embodiments 1 to 8, further comprising:

after the patternwise exposing and optional heating, removing the reactive composition in the non-exposed regions of the polymeric layer using a solvent in which the reactive composition is soluble or dispersible.

10. An intermediate article comprising a substrate and having disposed thereon a polymeric layer comprising exposed regions and non-exposed regions, the exposed regions comprising a pattern of an electroless seed metal compound comprising a non-reducing reagent in a de-blocked and crosslinked polymer derived from (a) a reactive polymer comprising -A- recurring units comprising pendant tertiary alkyl ester groups in an amount of at least 25 mol %, based on total (a) reactive polymer recurring units, and the non-exposed regions comprising a reactive composition that comprises:

the (a) reactive polymer comprising -A- recurring units comprising pendant tertiary alkyl ester groups in an amount of at least 25 mol %, based on total (a) reactive polymer recurring units, (b) a compound that provides an acid upon exposure to radiation having a $\lambda_{max}$ of at least 150 nm and up to and including 450 nm, which acid has a pKa of less than 2 as measured in water, (c) a crosslinking agent that is capable of reacting in the presence of the acid provided by the (b) compound to provide crosslinking in the (a) reactive polymer, and (d) optionally, a photosensitizer.

11. Any of embodiments 1 to 10, wherein the (c) crosslinking agent is part of the (a) reactive polymer as -B- recurring units comprising pendant groups that provide crosslinking in the presence of the acid provided by the (b) compound, which -B- recurring units are present in the (a) reactive polymer in an amount of at least 2 mol %, based on the total (a) reactive polymer recurring units.

12. Any of embodiments 1 to 11, wherein the (c) crosslinking agent is a compound distinct from the (a) reactive polymer.

13. Embodiments 12, wherein the (c) crosslinking agent is an aziridine, carbodiimide, isocyanate, ketene, glycoluril formaldehyde resin, polycarboxylic acid or anhydride, polyamine, epihalohydrin, diepoxide, dialdehyde, diol, carboxylic acid halide, or mixture thereof.

14. Any of embodiments 1 to 13, wherein the (a) reactive polymer comprises a backbone and arranged randomly along the backbone, -A- recurring units comprising pendant tertiary alkyl ester, the -A- recurring units being present in the (a) reactive polymer in an amount of at least 50 mol % and up to and including 98 mol % based on total (a) reactive polymer recurring units, and -B- recurring units comprising pendant epoxy groups in an amount of at least 2 mol % and up to and including 50 mol % based on total (a) reactive polymer recurring units.

15. Embodiment 14, wherein the (a) reactive polymer further comprises one or more additional -C- recurring units that are different from all -A- and -B- recurring units, the one or more additional -C- recurring units being present in an amount of at least 1 mol % and up to and including 25 mol % based on the total (a) reactive polymer recurring units.

16. Any of embodiments 1 to 15, wherein the (a) reactive polymer comprises pendant tertiary alkyl ester groups comprising a tertiary alkyl group having 4 to 8 carbon atoms.

17. Any of embodiments 1 to 16, wherein the (a) reactive polymer comprises pendant t-butyl ester groups.

18. Any of embodiments 1 to 17, wherein the (a) reactive polymer comprises at least 50 weight % and up to 97 weight % of the total dry weight of the polymeric layer.

19. Any of embodiments 1 to 18, wherein the (b) compound is an onium salt

20. Any of embodiments 1 to 19, wherein the (b) compound is an arylsulfonium salt or aryliodonium salt that provides an acid having a pKa of less than 2 as measured in water.

21. Any of embodiments 1 to 20, wherein the (d) photosensitizer is present in the polymeric layer in an amount of at least 1 weight % based on the total solids in the polymeric layer.

The following Examples are provided to illustrate the practice of this invention and are not meant to be limiting in any manner.

Preparation of the Electroless Copper Plating Bath:

The following components were dissolved in a glass container that had been cleaned with concentrated nitric acid followed by a thorough rinse with distilled water to eliminate any trace of metal on the glass: Copper (II) sulfate pentahydrate (1.8 g), 6.25 g of tetrasodium EDTA (ethylenediaminetetraacetic acid) tetrahydrate, 0.005 g of potassium ferrocyanide trihydrate, 2.25 g of a 37 weight % formaldehyde solution, 80 g of distilled water, and about 2-3 g of a 45 weight % sodium hydroxide solution to adjust the pH of the resulting solution to 12.8.

Preparation of Polymer A: Copolymer of t-Butyl Methacrylate (t-B) and Glycidyl Methacrylate (G) in a 90:10 Recurring Unit Nominal Molar Ratio:

A single neck, round bottom flask was charged with 17.92 g (0.126 mol) of t-butyl methacrylate ($M_w$ of 142.20 g/mole), 1.99 g (0.014 mol) of glycidyl methacrylate ($M_w$ of 142.15 g/mole), 0.10 g (0.5 weight % of total solids) of 2,2'-azodi(2-methylbutyronitrile) (AMBN), and 60 g of tetrahydrofuran (THF). The contents were purged with nitrogen for about 1 hour and then heated in a constant temperature bath at 65° C. overnight. The resulting product was precipitated twice into heptane with the solids collected between each precipitation and then re-dissolved in THF. The desired polymer product was then placed in a vacuum oven overnight at low heat and then determined to have a $M_w$ of about 94,000 as determined by SEC and a glass transition temperature of about 100° C. as determined by DSC.

Polymer B was prepared similarly to Polymer A except the glycidyl methacrylate (Gm) monomer was omitted from the preparation so that Polymer B contained no crosslinkable recurring units. Thus, Polymer B was a homopolymer derived solely from t-butyl methacrylate.

Preparation of Article F1:

Polymer A (1.200 g) and triphenylsulfonium triflate salt (0.138 g, a monomer to onium salt molar ratio of 25:1) were dissolved in 10.662 g of cyclopentanone with stirring then filtered using a 0.2 μm filter. Polymeric layers were prepared by spin coating the reactive composition at 1200 RPM onto a PET substrate with a cross-linked polymeric adhesion layer of copolymers derived from n-butyl acrylate and glycidyl methacrylate. The resulting precursor Article F1 with the polymeric layer was exposed to broadband ultraviolet light through a chrome-on-quartz contact mask for 90 seconds, followed by contact with a vacuum hotplate at 110° C. for 2 minutes.

Preparation of Article F2:

Polymer B (1.200 g) and triphenylsulfonium triflate salt (0.138 g, a monomer to onium salt molar ratio of 25:1) were dissolved in 10.662 g of cyclopentanone with stirring then filtered using a 0.2 μm filter. A polymeric layer was prepared by spin coating this reactive composition at 1200 RPM onto a PET substrate with a cross-linked polymeric adhesion layer of copolymers derived from n-butyl acrylate and glycidyl methacrylate. The resulting precursor Article F2 with the polymeric layer was exposed to broadband ultraviolet light through a chrome-on-quartz contact mask for 90 seconds, followed by contact with a vacuum hotplate at 110° C. for 2 minutes.

Inventive Example 1

Precursor article F1 was immersed in a 0.4 molar silver nitrate solution for 3 minutes, rinsed in distilled water for 2 minutes, immersed in an aqueous-based 0.01 molar potassium hydroxide bath for 5 minutes, rinsed in distilled water for 2 minutes, and then dried with compressed nitrogen. The polymeric layer was then evaluated for visual density in both exposed and non-exposed regions using an X-rite densitometer. The intermediate article was then immersed in the aqueous-based electroless copper bath described above for 3 minutes at 20 C. A continuous copper film was formed in all exposed regions of the polymeric layer in a resulting product article. Line widths of 5 to 6 μm diameter were faithfully reproduced and showed high conductivity. The resulting data are shown below in TABLE I.

Comparative Example 1

Precursor article F2 was immersed in a 0.4 molar silver nitrate solution for 3 minutes, rinsed in distilled water for 2 minutes, immersed in an aqueous-based 0.01 molar potassium hydroxide bath for 5 minutes, rinsed in distilled water for 2 minutes, and then dried with compressed nitrogen. The polymeric layer was then evaluated for visual density in both exposed and non-exposed regions using an X-rite densitometer. The intermediate article was then immersed in the aqueous-based electroless copper bath described above for 3 minutes at 20° C. The resulting data are shown below in TABLE I.

TABLE I

| Example | Polymer | Pre-copper Non-exposed Density | Pre-copper Exposed Density | Copper Non-exposed Density | Copper Exposed Density | Conductivity |
|---|---|---|---|---|---|---|
| Inventive 1 | A | 0.02 | 0.02 | 0.04 | 2.28 | Excellent |
| Comparative 1 | B | 0.02 | 0.02 | 0.03 | washed off | None |

The data provided by Invention Example 1 show that a metal ion can be reacted with hydroxide to form metal oxide particles capable of catalyzing an electroless plating composition. This method can be used to form electrically conductive features that faithfully match the image of the exposure mask. The results from Comparative Example 1 indicate that the exposed areas of the polymeric layer comprising only the homopolymer (Polymer B) washed off in the aqueous-based processing baths. It is apparent that at least 2 mol % of recurring units derived from glycidyl methacrylate is desirable in the reactive polymer to prevent the exposed regions from dissolving in the aqueous-based processing baths.

Invention Example 2

Precursor article F1 was immersed in a 0.4 molar silver nitrate solution for 3 minutes, rinsed in distilled water for 2 minutes, immersed in an aqueous-based 1.0 weight % sodium oxalate bath for 5 minutes, rinsed in distilled water for 2 minutes, and then dried with compressed nitrogen. The polymeric layer was then evaluated for visual density in both exposed and non-exposed regions using an X-rite densitometer. The intermediate article was then immersed in the aqueous-based electroless copper bath described above for 3 minutes at 20 C. A continuous copper film was formed in all exposed regions of the polymeric layer in a resulting product article. Line widths of 5 to 6 μm diameter were faithfully reproduced and showed high conductivity. The resulting data are shown below in TABLE II.

Comparative Example 2

Precursor article F1 was immersed in a 0.4 molar silver nitrate solution for 3 minutes, rinsed in distilled water for 2 minutes, immersed in an aqueous-based 0.5 weight % potassium sulfide bath for 5 minutes, rinsed in distilled water for 2 minutes, and then dried with compressed nitrogen. The polymeric layer was then evaluated for visual density in both exposed and non-exposed regions using an X-rite densitometer. The intermediate article was then immersed in the aqueous-based electroless copper bath described above for 3 minutes at 20° C. The resulting data are shown below in TABLE II.

TABLE II

| Example | Compound | Copper Non-exposed Region Density | Copper Exposed Region Density | Conductivity |
|---|---|---|---|---|
| Invention 2 | $Na_2C_2O_4$ | 0.04 | 2.52 | Excellent |
| Comparative 2 | $K_2S$ | 0.04 | 0.06 | None |

The results in TABLE II show that the silver salt nuclei produced in Comparative Example 2 an electroless seed metal compound having a very high $pK_{sp}$ (silver sulfide, $pK_{sp}=49.2$) that was not capable of being amplified by the aqueous-based electroless bath. However, the silver salt nuclei produced in Invention Example 2 an electroless seed metal compound having a lower $pK_{sp}$ (silver oxalate, $pK_{sp}=11.3$) that was capable of being amplified by the aqueous-based electroless bath. The silver hydroxide compound produced in Invention Example 1 had a $pK_{sp}$ of 7.7.

The invention has been described in detail with particular reference to certain preferred embodiments thereof, but it will be understood that variations and modifications can be effected within the spirit and scope of the invention.

The invention claimed is:

1. A method for forming a pattern in a polymeric layer, the method comprising:
   providing a polymeric layer comprising a reactive composition that comprises:
   (a) a reactive polymer comprising -A- recurring units comprising pendant tertiary alkyl ester groups in an amount of at least 25 mol %, based on total (a) reactive polymer recurring units,
   (b) a compound that provides an acid upon exposure to radiation having a $\lambda_{max}$ of at least 150 nm and up to and including 450 nm, which acid has a pKa of less than 2 as measured in water,
   (c) a crosslinking agent that is capable of reacting in the presence of the acid provided by the (b) compound to provide crosslinking in the (a) reactive polymer, and
   (d) optionally, a photosensitizer,
   patternwise exposing the polymeric layer to radiation having a $\lambda_{max}$ of at least 150 nm and up to and including 450 nm, to provide a polymeric layer comprising non-exposed regions and exposed regions comprising a polymer comprising carboxylic acid groups,
   optionally heating the polymeric layer simultaneously with or after patternwise exposing the polymeric layer but before contacting the exposed regions of the polymeric layer with electroless seed metal ions at a temperature sufficient to generate pendant carboxylic acid groups in the (a) reactive polymer in the exposed regions of the polymeric layer,
   contacting the exposed regions of the polymeric layer with electroless seed metal ions to form a pattern of electroless seed metal ions in the exposed regions of the polymeric layer,
   contacting the pattern of electroless seed metal ions in the exposed regions of the polymeric layer with a non-reducing reagent that reacts with the electroless seed metal ions to form an electroless seed metal compound that has a $pK_{sp}$ of less than 40, and
   electrolessly plating the electroless seed metal compound deposited within the exposed regions of the polymeric layer with a metal that is the same as or different from the metal that is within the bound electroless seed metal compound.

2. The method of claim 1, wherein the (c) crosslinking agent is part of the (a) reactive polymer as -B- recurring units comprising pendant groups that provide crosslinking in the presence of the acid provided by the (b) compound, which -B- recurring units are present in the (a) reactive polymer in an amount of at least 2 mol %, based on the total (a) reactive polymer recurring units.

3. The method of claim 1, wherein the (c) crosslinking agent is a compound distinct from the (a) reactive polymer.

4. The method of claim 3, wherein the (c) crosslinking agent is an aziridine, carbodiimide, isocyanate, ketene, glycoluril formaldehyde resin, polycarboxylic acid or anhydride, polyamine, epihalohydrin, diepoxide, dialdehyde, diol, carboxylic acid halide, or mixture thereof.

5. The method of claim 1, wherein the (a) reactive polymer comprises a backbone and arranged randomly along the backbone,
   -A- recurring units comprising pendant tertiary alkyl ester, the -A- recurring units being present in the (a) reactive polymer in an amount of at least 50 mol % and up to and including 98 mol % based on total (a) reactive polymer recurring units, and
   -B- recurring units comprising pendant epoxy groups in an amount of at least 2 mol % and up to and including 50 mol % based on total (a) reactive polymer recurring units.

6. The method of claim 5, wherein the (a) reactive polymer further comprises one or more additional -C- recurring units that are different from all -A- and -B- recurring units, the one or more additional -C- recurring units being present in an amount of at least 1 mol % and up to and including 25 mol % based on the total (a) reactive polymer recurring units.

7. The method of claim 1, wherein the (a) reactive polymer comprises pendant tertiary alkyl ester groups comprising a tertiary alkyl group having 4 to 8 carbon atoms.

8. The method of claim 1, wherein the (a) reactive polymer comprises pendant t-butyl ester groups.

9. The method of claim 1, wherein the (a) reactive polymer comprises at least 50 weight % and up to 97 weight % of the total dry weight of the polymeric layer.

10. The method of claim 1, wherein the (b) compound is an onium salt.

11. The method of claim 1, wherein the (b) compound is an arylsulfonium salt or aryliodonium salt that provides an acid having a pKa of less than 2 as measured in water.

12. The method of claim 1, wherein the (d) photosensitizer is present in the polymeric layer in an amount of at least 1 weight % based on the total solids in the polymeric layer.

13. The method of claim 1, comprising contacting the exposed regions in the polymeric layer with electroless seed metal ions selected from the groups consisting of silver ions, platinum ions, palladium ions, gold ions, rhodium ions, iridium ions, nickel ions, tin ions, and copper ions.

14. The method of claim 1, wherein the electroless seed metal ions are provided as a metal salt or a metal-ligand complex.

15. The method of claim 1, comprising electrolessly plating with a metal that is selected from the group consisting of copper(II), silver(I), gold(IV), palladium(II), platinum(II), nickel(II), chromium(II), and combinations thereof.

16. The method of claim 1, further comprising heating the polymeric layer simultaneously with or immediately after patternwise exposing the polymeric layer at a temperature sufficient to generate pendant carboxylic acid groups in the (a) reactive polymer in the exposed regions of the polymeric layer.

17. The method of claim 1, comprising patternwise exposing the polymeric layer to radiation having a $\lambda_{max}$ of at least 150 nm and up to and including 330 nm.

18. The method of claim 1, wherein the electroless seed metal compound has a $pK_{sp}$ of at least 4 and less than 40.

19. The method of claim 1, comprising contacting the coordinated electroless seed metal ions in the exposed regions with the non-reducing agent that is a hydroxide, thiosulfate, carboxylate, or a combination thereof.

20. The method of claim 1, further comprising:
  after the patternwise exposing and optional heating, removing the reactive composition in the non-exposed regions of the polymeric layer using a solvent in which the reactive composition is soluble or dispersible.

21. An intermediate article comprising a substrate and having disposed thereon a polymeric layer comprising exposed regions and non-exposed regions,
  the exposed regions comprising a pattern of an electroless seed metal compound comprising a non-reducing reagent in a de-blocked and crosslinked polymer derived from (a) a reactive polymer comprising -A- recurring units comprising pendant tertiary alkyl ester groups in an amount of at least 25 mol %, based on total (a) reactive polymer recurring units, wherein the electroless seed metal compound has a $pK_{sp}$ of less than 40, and
the non-exposed regions comprising a reactive composition that comprises:
  the (a) reactive polymer comprising -A- recurring units comprising pendant tertiary alkyl ester groups in an amount of at least 25 mol %, based on total (a) reactive polymer recurring units,
  (b) a compound that provides an acid upon exposure to radiation having a $\lambda_{max}$ of at least 150 nm and up to and including 450 nm, which acid has a pKa of less than 2 as measured in water,
  (c) a crosslinking agent that is capable of reacting in the presence of the acid provided by the (b) compound to provide crosslinking in the (a) reactive polymer, and
  (d) optionally, a photo sensitizer.

* * * * *